United States Patent [19]
Suzuki et al.

[11] Patent Number: 5,424,577
[45] Date of Patent: Jun. 13, 1995

[54] LEAD FRAME FOR SEMICONDUCTOR DEVICE

[75] Inventors: Yasuhito Suzuki; Kazunari Michii, both of Itami, Japan

[73] Assignee: Mitsubishi Denki Kabushiki Kaisha, Tokyo, Japan

[21] Appl. No.: 219,940

[22] Filed: Mar. 30, 1994

[30] Foreign Application Priority Data

Apr. 1, 1993 [JP] Japan .................. 5-075785

[51] Int. Cl.$^6$ .................. H01L 23/48; H01L 23/50
[52] U.S. Cl. .................. 257/670; 257/672; 257/667
[58] Field of Search .................. 257/666, 666.2, 668, 257/670, 672, 669, 667

[56] References Cited

U.S. PATENT DOCUMENTS

| | | | |
|---|---|---|---|
| 4,994,895 | 2/1991 | Matsuzaki et al. | 257/674 |
| 5,014,113 | 5/1991 | Casto | 257/669 |
| 5,221,859 | 6/1993 | Kobayashi et al. | 257/676 |

FOREIGN PATENT DOCUMENTS

| | | | |
|---|---|---|---|
| 0150253 | 7/1986 | Japan | 257/666 |
| 0077145 | 9/1988 | Japan | 257/666 |
| 0058361 | 2/1990 | Japan | 257/666 |

Primary Examiner—Robert P. Limanek
Assistant Examiner—Alexander Oscar Williams
Attorney, Agent, or Firm—Leydig, Voit & Mayer

[57] ABSTRACT

A lead frame for semiconductor devices which does not require tie bar cutting in the manufacture of semiconductor devices includes a base lead frame having no tie bars and a dummy lead frame having dummy leads filling gaps between outer lead portions of the leads when the dummy lead frame is mounted on the base lead frame. Instead of tie bars, the dummy leads reinforce the leads and also stop molten sealing resin from flowing into the gaps between the outer lead portions during resin molding.

5 Claims, 13 Drawing Sheets

$W_1 = W_2$

LEAD FRAME FOR SEMICONDUCTOR DEVICE

BACKGROUND OF THE INVENTION

1. Field of the Invention

The present invention relates to a lead frame for use in manufacture of resin molded type semiconductor devices, and a method of manufacturing semiconductor devices using the lead frame.

2. Description of the Related Art

FIG. 17 is a plan view of a prior art lead frame for semiconductor devices. In FIG. 17, denoted by reference numeral 10 is a lead frame for semiconductor devices (hereinafter referred to as a lead frame), 11 is an island on which a semiconductor device 30 is mounted as shown at the right end in the figure, 12 is an inner lead portion connected to the semiconductor device 30 by a gold wire 31 for supplying electric power and transferring various signals, and 13 is an outer lead portion exposed outwardly of a later-described sealing resin 16 shown in FIG. 18. The outer lead portion 13 extends from the inner lead portion 12 in a continuous relation so as to form one lead. Further, 14 is a tie bar interconnecting leads while reinforcing them so that the leads will not move out of order. The tie bar also serves to stem a flow of resin during resin molding.

FIG. 18 is a plan view of the lead frame after resin molding. A sealing resin 16 is desirably formed to seal off the semiconductor device 30, the gold wire 31 and the inner lead 12 inside a broken line 32 in FIG. 17, but the resin flows out to the tie bars 14 in practice, as shown in FIG. 18. FIG. 19 is an enlarged view of an area E of the lead frame 10 after the step of resin molding in FIG. 18. A hatched portion 17 in FIG. 19 indicates a burr formed between the leads by a part of the sealing resin which is stopped by the tie bar 14 and hardened there.

FIG. 20 is an enlarged plan view showing the tie bars being cut in the lead machining process, in which 18 is a tie bar cutting punch for cutting the tie bars. FIG. 21 is a side view as viewed in the direction of an arrow F in FIG. 20, in which 19 is a tie bar cutting die for supporting the outer lead portions 13 in the step of die cutting.

Further, FIG. 22 is an enlarged plan view of the lead frame after cutting the tie bars, in which 20 is a leftover of the burr between the leads after being cut by the tie bar cutting punch 18, and 21 is a leftover of the tie bar 14 after being cut. The steps of manufacturing semiconductor devices by using the prior art lead frame, arranged as above, will be briefly described below with reference to a flowchart shown in FIG. 23.

First, as shown in FIG. 17, the semiconductor device 30 is die bonded onto the island 11 (die bonding step). Then, electrodes of the semiconductor device 30 mounted on the island 11 are connected to the inner lead portions 12 by the gold wires 31 (wire bonding step). After that, the lead frame 10 including the semiconductor devices 30 each connected to the associated inner lead portions 12 is set in a resin sealing mold (not shown). Resin molding is carried out to cover an area inside the broken line 32 in FIG. 17, including the island 11, the semiconductor device 30, the inner lead portions 12 and the gold wires 31, whereby the sealing resin 16 shown in FIG. 18 is formed (molding step). Then, the sealing resin 16 formed in the molding step, the lead frame 10, etc. are deburred (deburring step). Note that the burrs 17 between the leads are not removed in this step. Then, the outer lead portions 13 of the lead frame 10 are plated with solder (plating step).

The lead frame 10 thus resin molded and plated with solder is then transferred to a subsequent lead machining process. In this process, the tie bars 14 are cut by the tie bar cutting punch 18 as shown in FIGS. 20 and 21 (tie bar cutting step). Following that, the outer lead portions 13 are cut to the predetermined size and each semiconductor device is disconnected from the lead frame (lead cutting step). Finally, the leads are bent into the predetermined form (lead forming step).

In the tie bar cutting step of the lead machining process, as shown in FIGS. 20 and 21, parts of the tie bars 14 and the burrs 17 between the leads are simultaneously cut by cooperation of the tie bar cutting punch 18 and the tie bar cutting die 19. This results in the state as shown in FIG. 22 where the leftovers 20 of the burrs between the leads and the leftovers 21 of the tie bars after being cut remain in place. Additionally, the tie bar cutting punch 18 must have comblike edges corresponding to the pitch of the outer lead portions 13 and hence requires high accuracy.

The prior art lead frame for semiconductor devices arranged as previously described has had the following problems in manufacturing semiconductor devices.

First, the prior art lead frame entails the step of tie bar cutting, and comblike edges 18a of the tie bar cutting punch for cutting the tie bars became considerably worn, as indicated by broken lines in FIG. 24, as a result of the repeated cutting. Also, because the comblike edges 18a of the punch correspond to the pitch of the outer lead portions of the semiconductor device, they are very thin and liable to break. Therefore, it is hard to stably cut the tie bars 14, causing deformation of or damage to the leads. This has led to failed semiconductor devices and hence degraded production efficiency significantly.

Also, because the burrs between the leads are cut as well in the step of tie bar cutting, the outer lead portions are likely to be contaminated with burr chips that are scattered at the time of cutting.

Further, when the tie bars are positioned in a region where the leads are to be bent, the leads cannot be steadily shaped into the predetermined form because of the influence of the leftovers 21 of the tie bars after being cut, cutting burrs 13a caused upon cutting the tie bars as shown in FIG. 24, fractured surfaces, and so on. In gullwing type semiconductor devices, particularly, the flatness of a plane defined by distal ends of the leads to be mounted to a circuit substrate or the like is reduced. Incidentally, the more the comblike edges 18a of the punch are worn, the larger the cutting burrs 13a.

Manufacture of the tie bar cutting punch is difficult, for a punch used for semiconductor devices with outer lead portions having a fine pitch less than 0.4 mm, comblike edges of the punch because the pitch is so small and the durability of the outer lead portions is not ensured in mass production because the comblike edges are too thin.

SUMMARY OF THE INVENTION

With a view of solving the problems as discussed above, an object of the present invention is to provide a lead frame for semiconductor devices and a method of manufacturing semiconductor devices using the lead frame, in which the step of tie bar cutting can be omitted to thereby ensure mass-production of high-quality semiconductor devices.

To achieve the above object, the invention according to the first aspect resides in a lead frame for semiconductor devices which is used in manufacturing resin molded type semiconductor devices, the lead frame comprising a base lead frame and a dummy lead frame, wherein the base lead frame has a number of leads which comprise inner lead portions sealed in a molded sealing resin and outer lead portions exposed to the outside, the leads extending toward the center, side by side from a frame portion in the frame form, the dummy lead frame being placed over the base lead frame in use and having a number of dummy leads which extend, side by side, from a frame portion in the frame form so as to fill gaps between the outer lead portions of the leads in a superposed condition of both the frames.

The invention according to the second aspect resides in a lead frame for semiconductor devices according to the first aspect, wherein superposed portions of the base lead frame and the dummy lead frame have the same thickness as the other portions of both the frames in the superposed condition.

The invention according to the third aspect resides in a lead frame for semiconductor devices according to the first aspect, wherein the dummy leads of the dummy lead frame are formed in such a length as to extend to just near the inner lead portions of the leads of the base lead frame.

The invention according to the fourth aspect resides in a lead frame for semiconductor devices according to the first aspect, wherein the dummy lead frame is formed of a material having a larger coefficient of linear expansion than the material of the base lead frame so that the dummy leads fill the gaps between the outer lead portions more positively when heated.

The invention according to the fifth aspect resides in a lead frame for semiconductor devices according to the first aspect, wherein the dummy leads of the dummy lead frame are bent to fill the gaps between the outer lead portions of the leads when the dummy lead frame is placed over the base lead frame.

Further, the invention according to the sixth aspect resides in a method of manufacturing semiconductor devices using a lead frame comprising a base lead frame having leads extending toward an island at the center from a frame portion in a frame form, and a dummy lead frame being assembled on the base lead frame in use and having dummy leads extending from a frame portion in a frame form so as to fill gaps between outer lead portions of the leads in an assembled condition of both the frames, wherein the method comprises a step of assembling the base lead frame and the dummy lead frame together, a package forming step of mounting a semiconductor device on the island and forming a sealing resin to mold the semiconductor device, a frame separating step of removing the dummy lead frame, and a lead machining step of disconnecting the resin-molded semiconductor device, comprising a package and the outer lead portions, from the frame portion and machining the outer lead portions.

With the invention according to the first aspect, the lead frame comprises the base lead frame having no tie bars, and the dummy lead frame provided with the dummy leads filling gaps between the outer lead portions of the leads when the dummy lead frame is placed over the base lead frame. Instead of tie bars, the dummy leads serve not only to reinforce the leads, but also stop the molten sealing resin which tends to flow into the gaps between the outer lead portions during resin molding.

With the invention according to the second aspect, the superposed portions of the base lead frame and the dummy lead frame are half etched, for example, so as to have the same thickness as the other portions of both the frames in the superposed condition. Accordingly, the lead frame of the invention has the same thickness as the prior art one and hence can be used in conventional apparatus for manufacturing semiconductor devices.

With the invention according to the third aspect, the dummy leads of the dummy lead frame are formed in such a length as to extend to just near the inner lead portions of the leads of the base lead frame, i.e., the sealing resin, whereby the sealing resin which flows into the gaps between the outer lead portions during resin molding can be reduced to the utmost.

With the invention according to the fourth aspect, the dummy lead frame is formed of a material having a larger coefficient of linear expansion than a material of the base lead frame so that the dummy leads fill the gaps between the outer lead portions more positively when heated, whereby burrs caused between the leads can be made quite small.

With the invention according to the fifth aspect, the dummy leads of the dummy lead frame are so bent as to fill the gaps between the outer lead portions of the leads when the dummy lead frame is placed over the base lead frame.

With the method of manufacturing semiconductor devices according to the sixth aspect of the invention, the steps until the package forming step are carried out by using the lead frame according to the first aspect under a condition that the dummy lead frame is placed over the base lead frame. In these steps, the dummy leads serve to, instead of the tie bars, reinforce the leads and stop the sealing resin. After that, the dummy lead frame is separated from the base lead frame. Accordingly, it is possible to omit the step of tie bar cutting and to manufacture highly reliable products in which failures due to, e.g., deformation of the leads are reduced to the utmost. In addition, the problem that burr chips are scattered upon cutting the tie bars is eliminated, and the tie bar cutting punch which has been used to cut the tie bars and requires high dimensional accuracy corresponding to the pitch of the outer lead portions is no longer required.

DETAILED DESCRIPTION OF PREFERRED EMBODIMENTS

Embodiment 1

Hereinafter, one embodiment of the present invention will be described. FIGS. 1 to 4 show a lead frame for semiconductor devices according to one embodiment of the present invention. A lead frame of the present invention comprises a base lead frame 110 shown in FIG. 1 and a dummy lead frame shown in FIG. 3.

Figure 1:
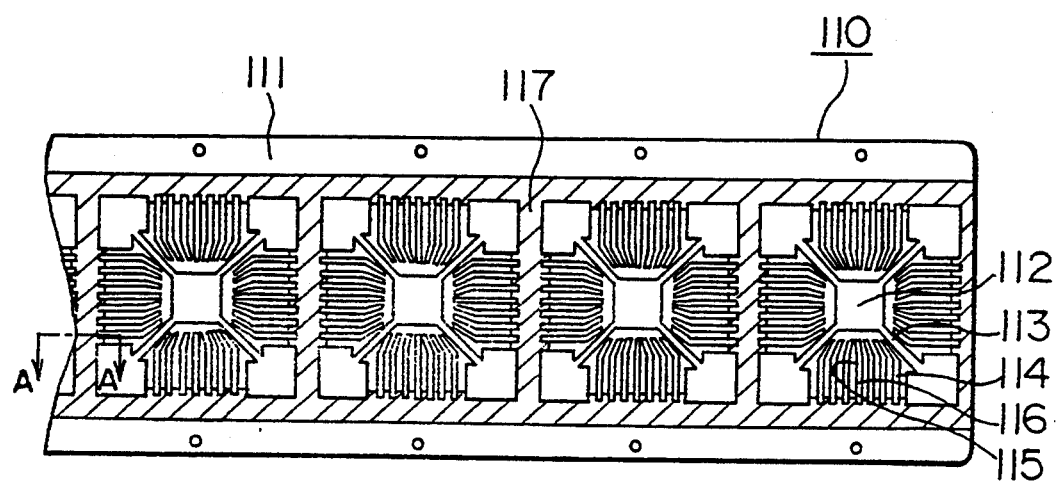
FIG. 1 is a plan view of a base lead frame of a lead frame for semiconductor devices according to one embodiment of the present invention.
Figure 2:
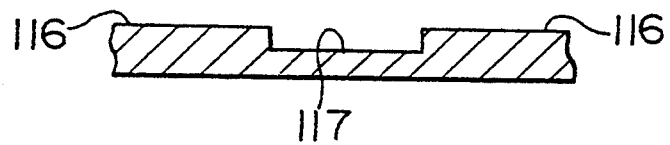
FIG. 2 is a sectional view taken along line A—A in FIG. 1.

FIG. 1 is a plan view of the base lead frame 110, and FIG. 2 is a sectional view taken along line A—A in FIG. 1. In the base lead frame 110, denoted by 111, is a frame portion serving to interconnect the following members: an island 112 on which a semiconductor device 30 is mounted as shown at the right end in FIG. 5 described later, suspension leads 113 for coupling the island 112 to the frame portion 111, and leads 114. The leads 114 each comprise an inner lead portion 115 which is connected to the semiconductor device 30 by a gold wire 31 (see FIG. 5) and is then resin molded, and an outer lead portion 116 which is not resin molded. A hatched area 117 represents a half-etched portion on which, when placing a dummy frame 120 shown in FIG. 3 over the base lead frame 110, a frame portion of the dummy frame 120 is superposed. As shown in FIG. 2, the half-etched portion 117 is half etched on the side facing the dummy lead frame 120. Note that the lead frame of the invention includes no tie bar and, instead of the tie bar, later-described dummy leads serve to reinforce the leads and to stop molten sealing resin from flowing out during resin molding.

Figure 3:
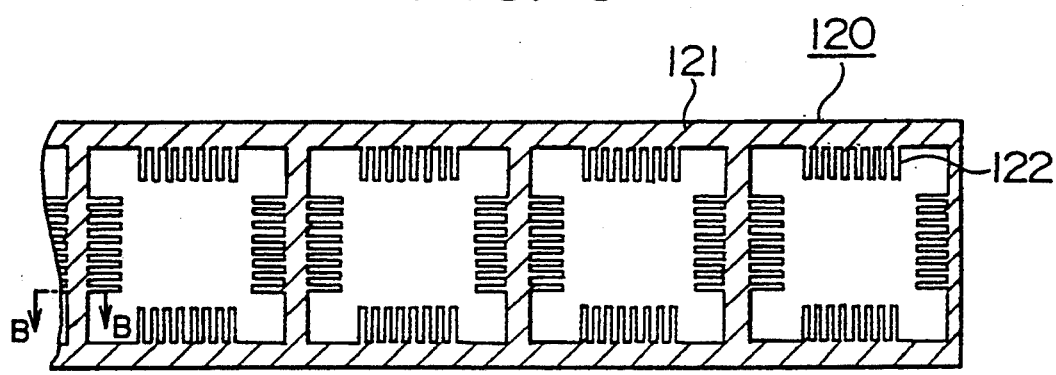
FIG. 3 is a plan view of a dummy lead frame of the lead frame for semiconductor devices according to one embodiment of the present invention.
Figure 4:
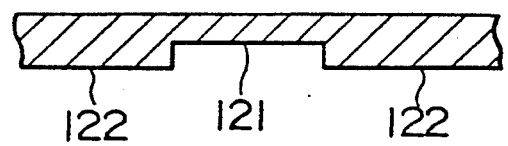
FIG. 4 is a sectional view taken along line B—B in FIG. 3.

FIG. 3 is a plan view of the dummy lead frame 120, and FIG. 4 is a sectional view taken along line B—B in FIG. 3. The dummy lead frame 120 comprises a frame portion 121 and dummy leads 122. The dummy leads 122 are each inserted between adjacent pairs of the outer lead portions 116 so as to fill a gap therebetween when placed over the base lead frame 110 of FIG. 1. Since the frame portion 121 shown by hatching is superposed on the base lead frame 110 of FIG. 1, it is half etched on the side facing the base lead frame 110, as shown in FIG. 4.

Figure 5:
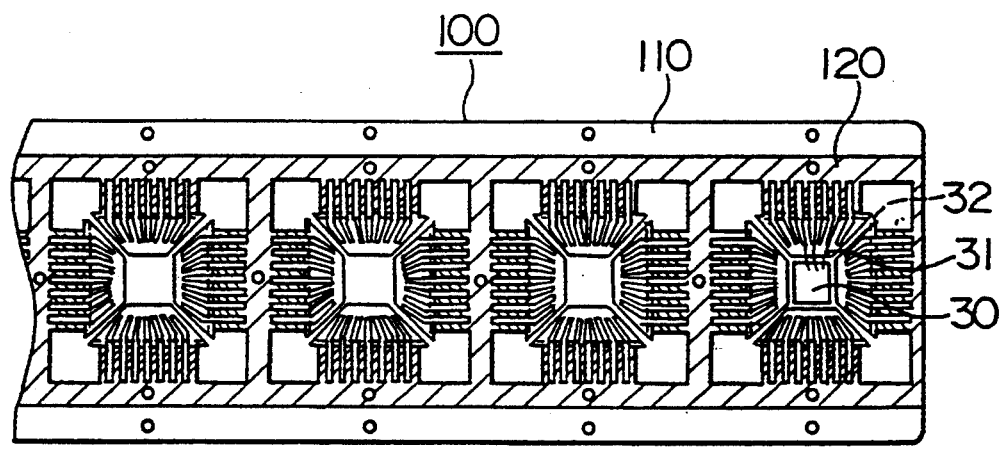
FIG. 5 is a plan view showing a condition that the dummy lead frame of FIG. 3 is placed over the base lead frame of FIG. 1.

FIG. 5 is a plan view of a lead frame 100 comprising the base lead frame 110 and the dummy lead frame 120 in a superposed condition, in which the dummy lead frame 120 is shown by hatching. An area inside a broken line 32 is covered with a sealing resin.

Figure 6A:
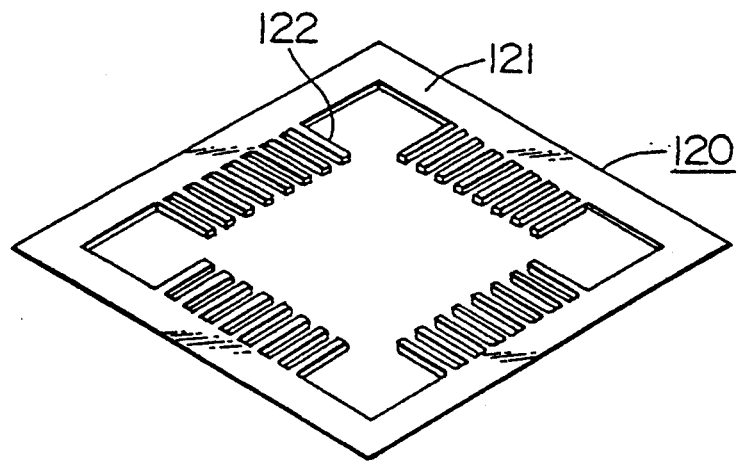
FIG. 6A is a perspective view of the dummy lead frame of FIG. 3.
Figure 6B:
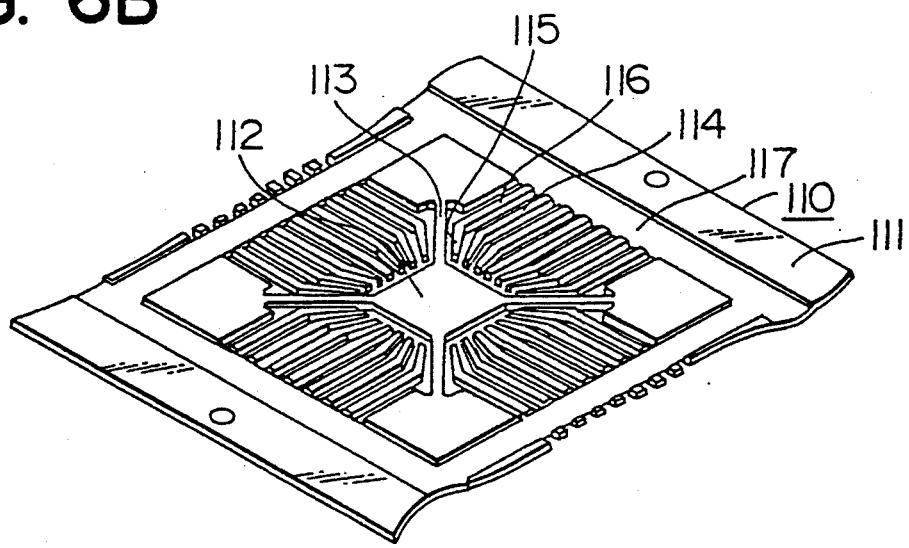
FIG. 6B is a perspective view of the base lead frame of FIG. 1.
Figure 6C:
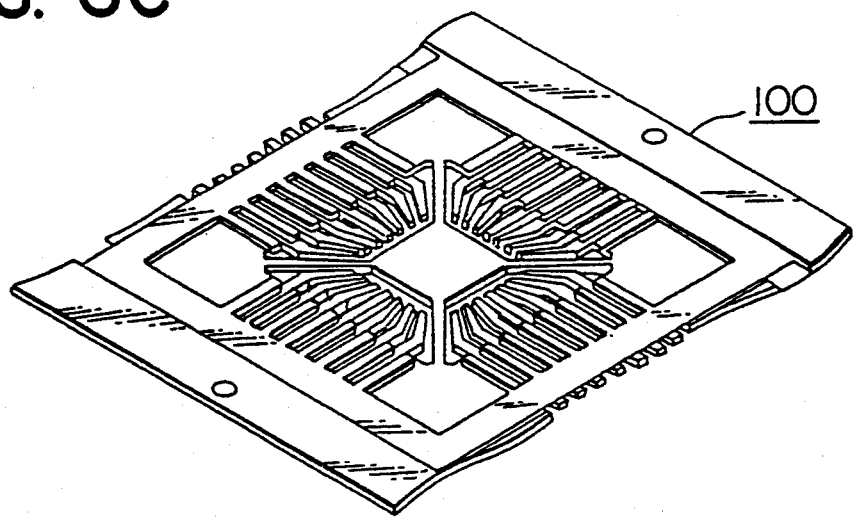
FIG. 6C is a perspective view showing the dummy lead frame placed over the base lead frame.
Figure 7A:
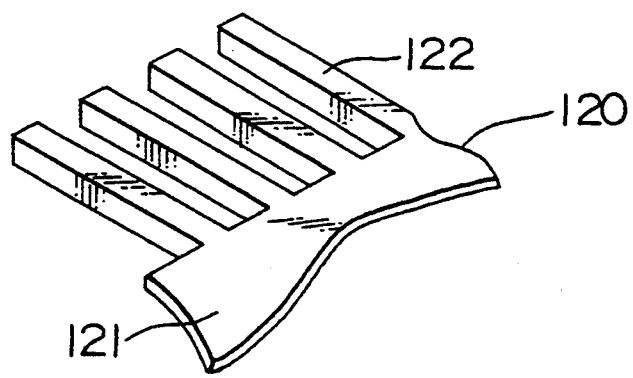
FIG. 7A is a partial enlarged perspective view of the dummy lead frame of FIG. 3.
Figure 7B:
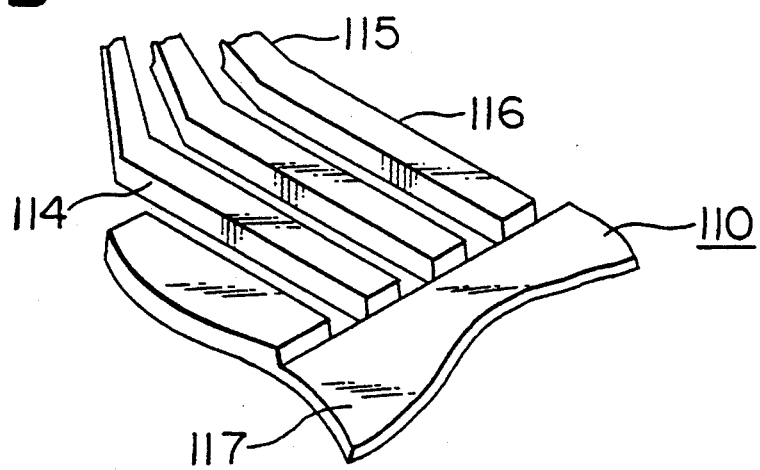
FIG. 7B is a partial enlarged perspective view of the base lead frame of FIG. 1.
Figure 7C:
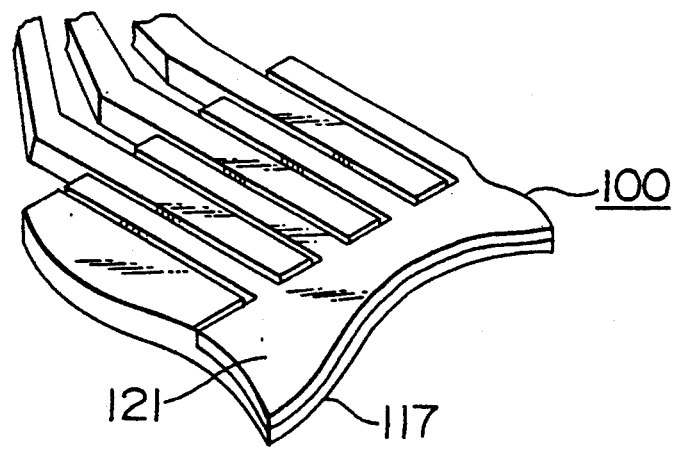
FIG. 7C is a partial enlarged perspective view showing the dummy lead frame placed over the base lead frame

FIGS. 6A to 6C and FIGS. 7A to 7C are illustrations for explaining how the base lead frame 110 and the dummy lead frame 120 are superposed. Specifically, FIGS. 6A, 6B and 6C are perspective views respectively showing the dummy lead frame 120, the base lead frame 110, and a condition that the dummy lead frame 120 is placed over the base lead frame 110. Further, FIGS. 7A to 7C show parts of FIGS. 6A to 6C in enlarged scale; i.e., FIGS. 7A, 7B and 7C are partial enlarged perspective views respectively showing the dummy lead frame 120, the base lead frame 110, and a condition that the dummy lead frame 120 is placed over the base lead frame 110. Assuming that the thickness of the prior art lead frame is "1", for example, the dummy lead frame 120 has a thickness of "0.5" only in the frame portion 121 and the base lead frame 110 has a thickness of "0.5" only in a half-etched portion 117, i.e., a portion on which the frame portion 121 of the dummy lead frame 120 is placed. Thus, the thickness of the lead frame 100 is kept at "1" as with the existing lead frame.

Figure 8:
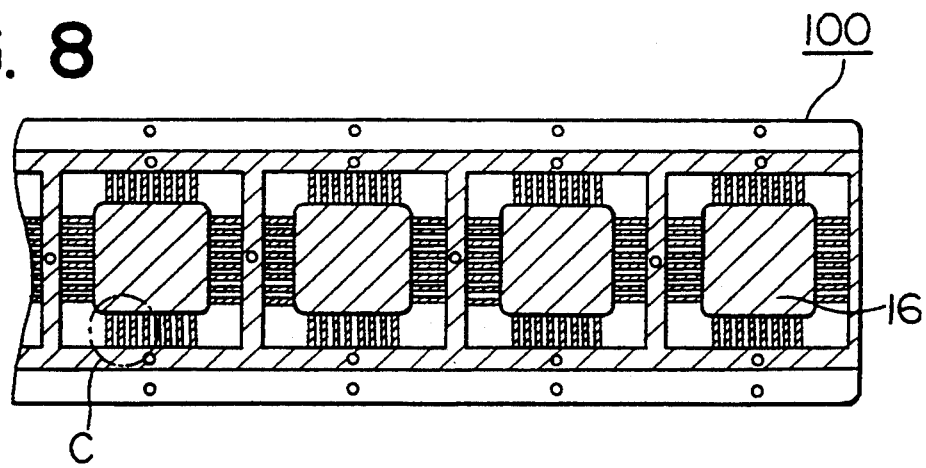
FIG. 8 is a plan view of the lead frame in the condition of FIG. 5 after the step of resin molding.
Figure 9:
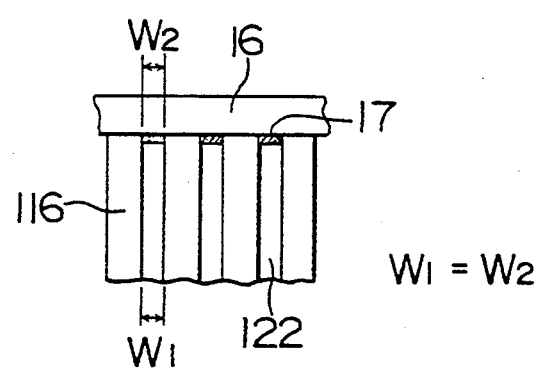
FIG. 9 is an enlarged view of an area C in FIG. 8.
Figure 10:
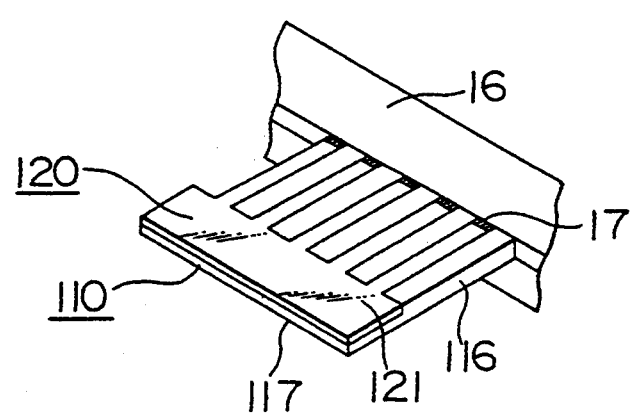
FIG. 10 is an enlarged perspective view of the area C in FIG. 8.
Figure 11:
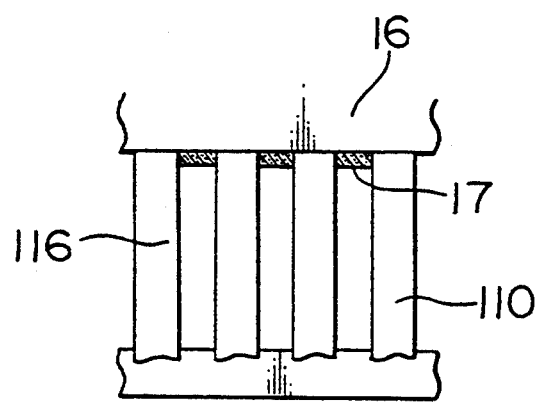
FIG. 11 is an enlarged view of the area C in FIG. 8 after the dummy lead frame has been removed.
Figure 12:
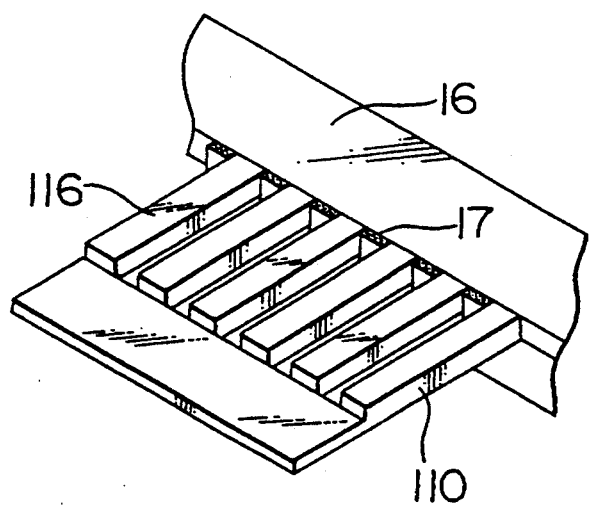
FIG. 12 is an enlarged perspective view of the area C in FIG. 8 after the dummy lead frame has been removed.

FIG. 8 shows the lead frame after the step of resin molding, FIG. 9 is an enlarged view of an area C in FIG. 8, and FIG. 10 is an enlarged perspective view of the area C. Also, FIG. 11 is an enlarged view of the area C after the dummy lead frame has been removed from the two-layered lead frame having been resin molded, and FIG. 12 is an enlarged perspective view of FIG. 11.

Figure 13:
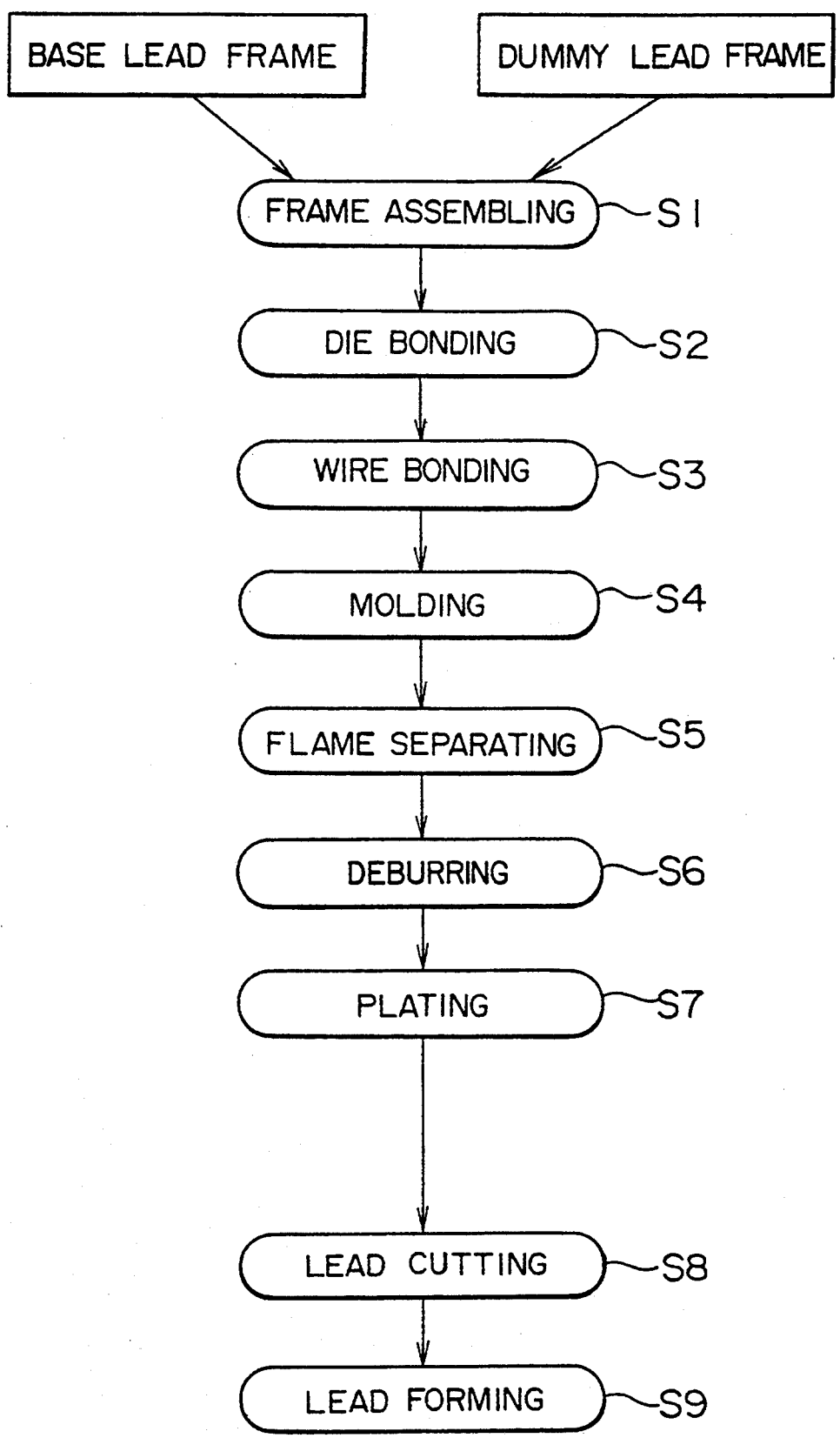
FIG. 13 is a flowchart showing a method of manufacturing semiconductor devices according to one embodiment of the present invention.

The steps of manufacturing semiconductor devices using the lead frame of the invention, arranged as above, will be briefly described below with reference to a flowchart shown in FIG. 13.

Figure 14:
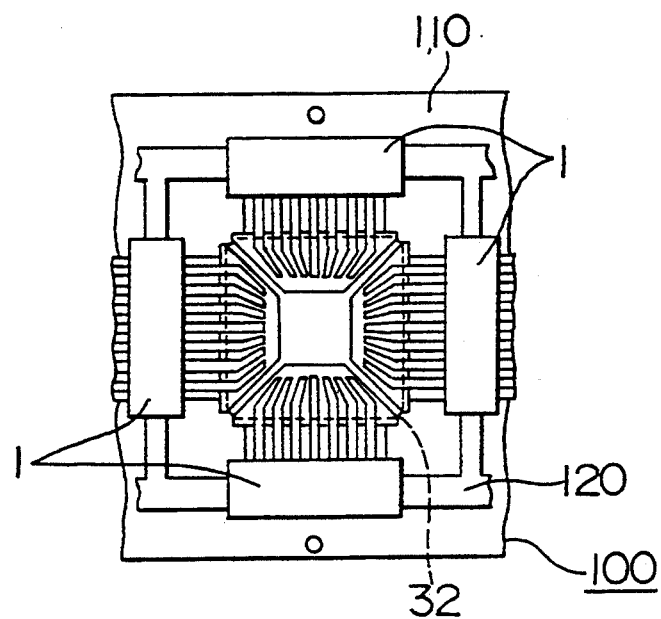
FIG. 14 is a plan view showing portions of the base lead frame and the dummy lead frame joined by tapes.
Figure 15:
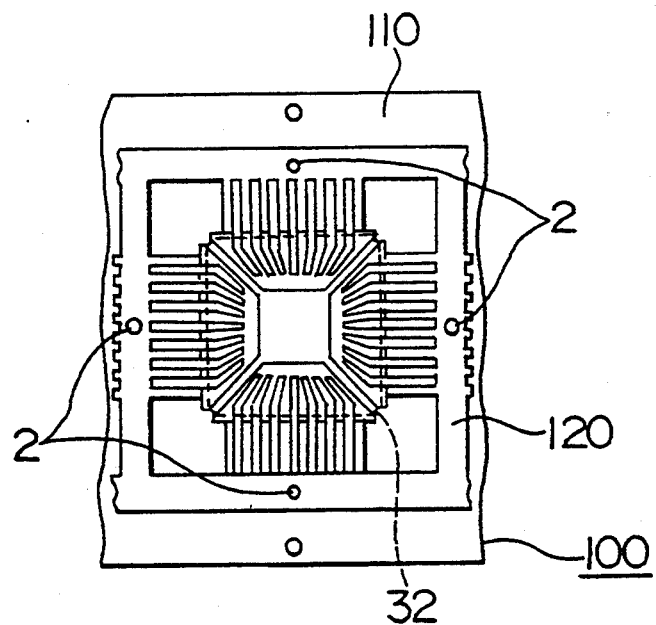
FIG. 15 is a plan view showing portions of the base lead frame and the dummy lead frame joined by spot welding.

First, before mounting semiconductor devices, as shown in FIGS. 5 to 7C, the base lead frame 110 and the dummy lead frame 120 are assembled with each other (frame assembling step). As shown in FIG. 9, the dummy leads 122 of the dummy lead frame 120 have the width W2 substantially equal to a width W1 of the spacing (gap) between the outer lead portions 116 of the base lead frame 110, and each dummy lead 122 is inserted between adjacent pairs of the outer lead portions 116. The leads 114 of the base lead frame 110 are thereby reinforced so as not to deform during the manufacturing process. The respective superposed portions of the base lead frame 110 and the dummy lead frame 120 (i.e., the half-etched portion 117 of the base lead frame 110 and the frame portion 121 of the dummy lead frame 120) are half-etched so that the superposed portions have the same thickness as the prior art frame. This arrangement is considered in order that the lead frame 100 of the invention can be used in conventional apparatus (not shown) for manufacturing semiconductor devices without any modifications. The base lead frame 110 and the dummy lead frame 120 may be fixed to each other, for example, by tapes 1 or spot welding indicated at 2, as shown in FIGS. 14 and 15, respectively to prevent the two frames from separating during the manufacturing process.

The subsequent steps until the molding step are carried out in a like manner to the prior art. More specifically, as shown at the right end in FIG. 5, the semiconductor device 30 is die bonded onto the island 112 (die bonding step), and the semiconductor device 30 and the inner lead portions 12 are wire bonded by the gold wires 31 (wire bonding step). Then, the assembly is subjected to resin molding to cover an area inside the broken line 32 (molding step). A sealing resin 16 is thereby formed as a package. FIG. 8 shows the lead frame after being resin molded. As shown in FIGS. 9 and 10, burrs 17 formed between the leads during the step of resin molding are stopped by the dummy leads 122 and molten resin will essentially not flow into the gaps between the outer lead portions 116. In other words, by setting the length of the dummy leads 122 so that their distal ends extend to just near the inner lead portions 115, i.e., the sealing resin 16, the dummy leads can not only function (reinforce) to prevent deformation of and damage to the leads, but also serve to stop the molten sealing resin.

After the step of resin molding, the dummy lead frame 120 is separated from the base lead frame 110 by, for example, removing the tapes 1 by which the base lead frame 110 and the dummy lead frame 120 are fixed together (frame separating step). FIGS. 11 and 12 show a condition after the dummy lead frame 120 has been separated and removed. The base lead frame 100 in that condition is subjected to deburring and solder plating as with the prior art (deburring step and plating step).

The base lead frame 110 thus resin molded and plated with solder is then transferred to a subsequent lead machining process. In this process, the step of tie bar cutting carried out in the prior art is not required. The outer lead portions 116 are cut to the predetermined size and each semiconductor device is disconnected from the lead frame (lead cutting step). Finally, the leads are bent into the predetermined form (lead forming step).

It should be noted that the package forming step in the method according to the sixth aspect includes the die bonding step, wire bonding step, and molding step. Also, the lead machining step includes the deburring step, plating step, lead cutting step, and lead forming step.

Figure 24:
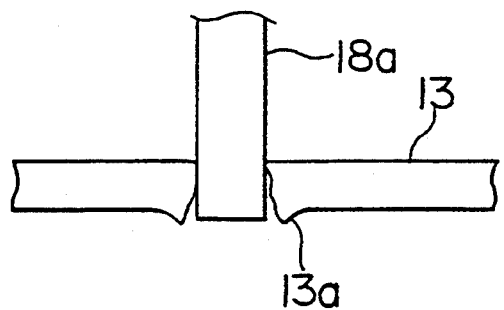
FIG. 24 is a side view for explaining cutting burrs caused upon cutting the tie bars.
Figure 23:
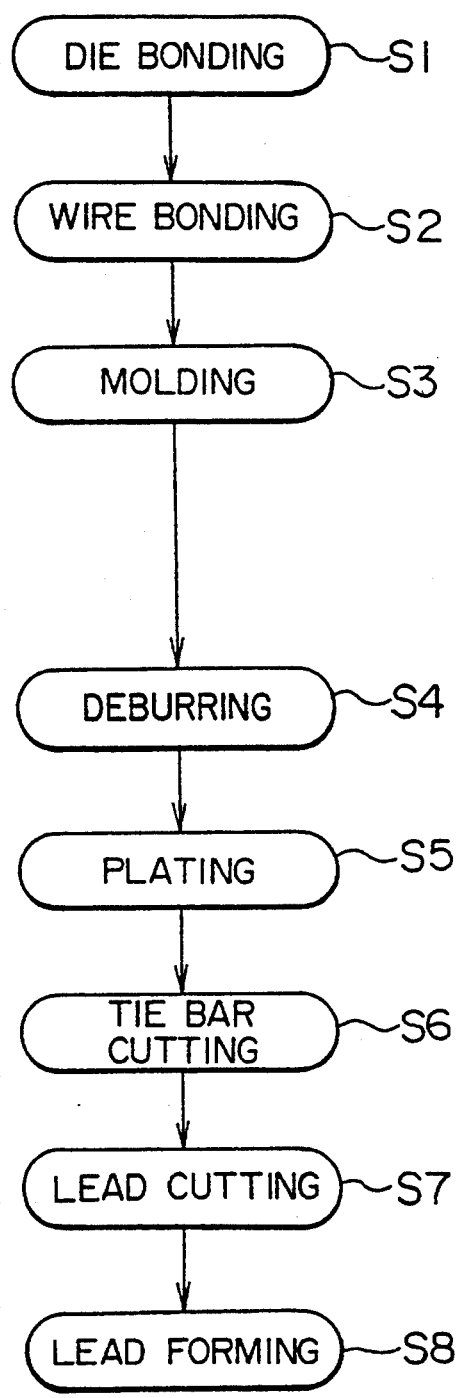
FIG. 23 is a flowchart showing a prior art manufacture method of semiconductor devices.

As described above, when semiconductor devices are manufactured using the lead frame of the present invention, the step of tie bar cutting is no longer needed. It is therefore possible to avoid the problems of the prior art that wear or breakage of the tie bar cutting punch leads to failed products, and that chips of the burrs between the leads are scattered upon cutting the tie bars. Also, the necessity of manufacturing the comblike edges of the tie bar cutting punch, which require high accuracy, is eliminated. Further, since neither the remnants of the tie bars after being cut nor the cutting burrs (see 13a in FIG. 24) are present, the leads can be stably shaped in the lead forming step. For the gullwing type leads, flatness of a mounting plane defined by distal ends of the leads is improved.

Since the base lead frame and the dummy lead frame are respectively provided with the half-etched portions so that the lead frame in the superposed condition has the same thickness as the prior art lead frame, the lead frame of the invention can be used in conventional apparatus (not shown) for manufacturing semiconductor devices without any modifications.

By setting the length of the dummy leads so that their distal ends extend to just near the inner lead portions of the leads of the base lead frame, the burrs 17 between the leads can be made quite small.

Additionally, even in the case of manufacturing semiconductor devices with outer lead portions having a fine pitch, it is easy to obtain the desired products without suffering from restrictions concerned with the manufacturing technique for the tie bar cutting punch.

Embodiment 2

While the above embodiment is described as using the same material for the base lead frame 110 and the dummy lead frame 120, these frames may be formed of different materials. Particularly, by selecting the material of the dummy lead frame to have a larger coefficient of linear expansion (thermal expansion) than the material of the base lead frame, the outer lead portions 116 of the base lead frame 110 and the dummy leads 122 of the dummy lead frame 120 are more snugly fitted with each upon an increase in temperature when the lead frame is resin molded (i.e., in the molding step). As a result, the resin is more surely prevented from flowing and forming burrs.

Embodiment 3

While the respective superposed portions of the base lead frame and the dummy lead frame are half etched in the above embodiment, a description will now be given of an embodiment in which dummy leads of the dummy lead frame are bent so as to fit between the outer lead portions of the base lead frame.

Figure 16A:
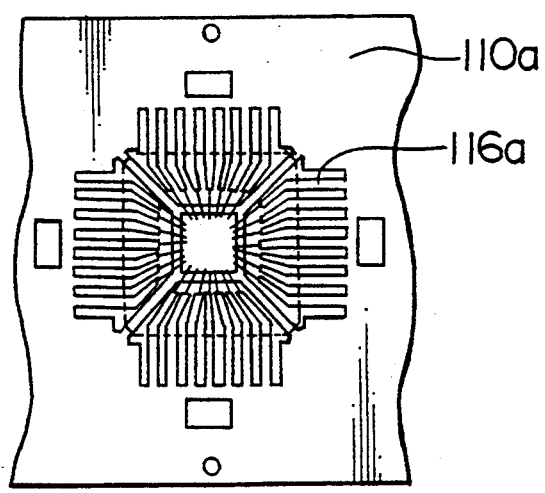
FIG. 16A is a plan view of a base lead frame of a lead frame for semiconductor devices according to another embodiment of the present invention.
Figure 16B:
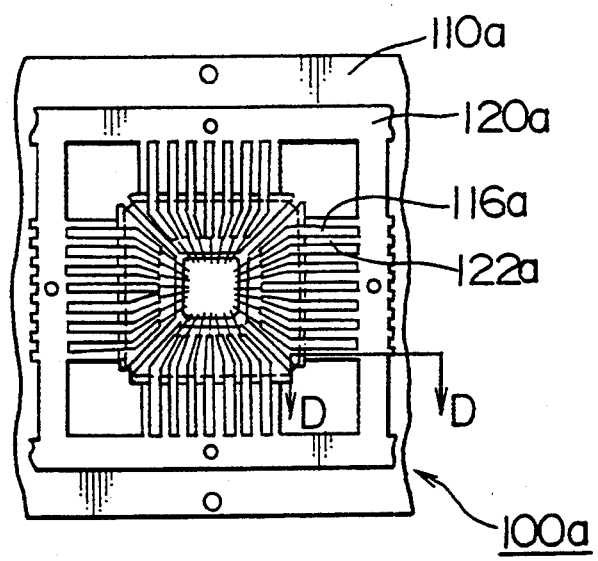
FIG. 16B is a plan view showing a condition that a bent dummy lead frame is placed over the base lead frame.
Figure 16C:
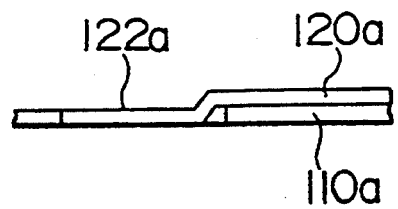
FIG. 16C is a sectional view taken along line D—D in FIG. 16B.
Figure 17:
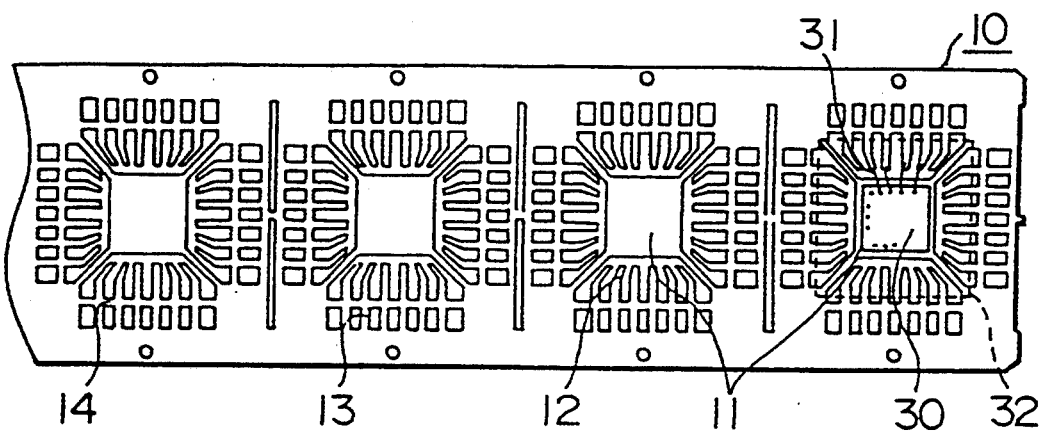
FIG. 17 is a plan view showing a prior art lead frame for semiconductor devices.
Figure 18:
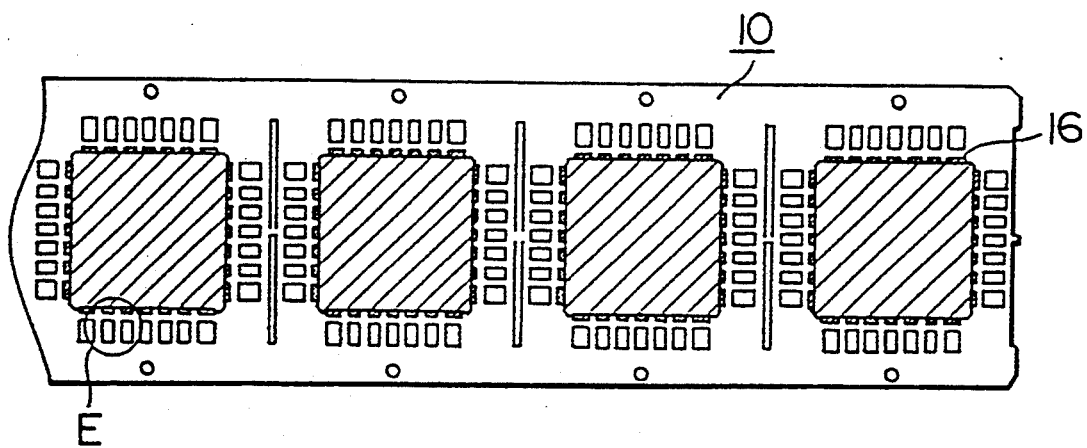
FIG. 18 is a plan view of the prior art lead frame for semiconductor devices after the step of resin molding.
Figure 19:
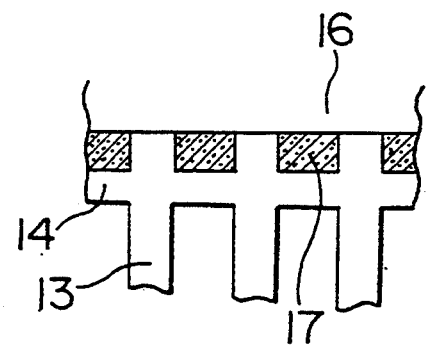
FIG. 19 is an enlarged view of an area E in FIG. 18.
Figure 20:
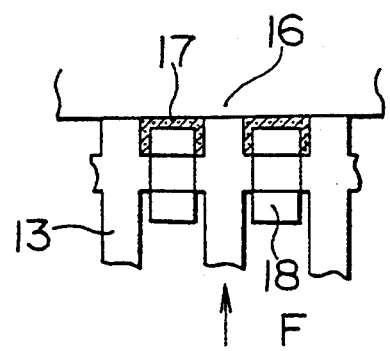
FIG. 20 is an enlarged view showing a condition that tie bars of the lead frame for semiconductor devices are being cut.
Figure 21:
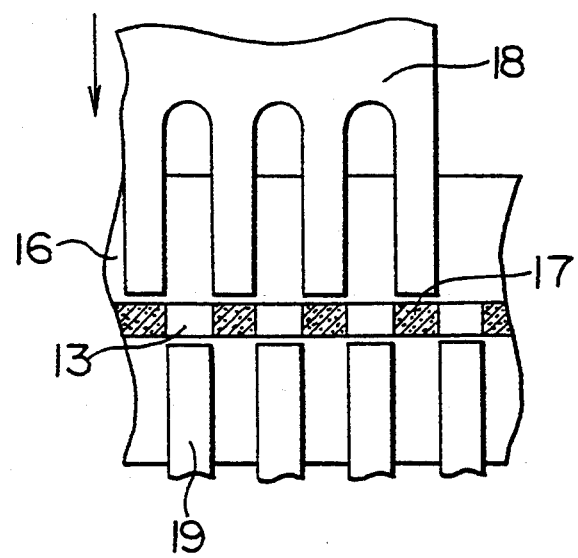
FIG. 21 is a side view of the lead frame for semiconductor devices as viewed in the direction as indicated by an arrow F.
Figure 22:
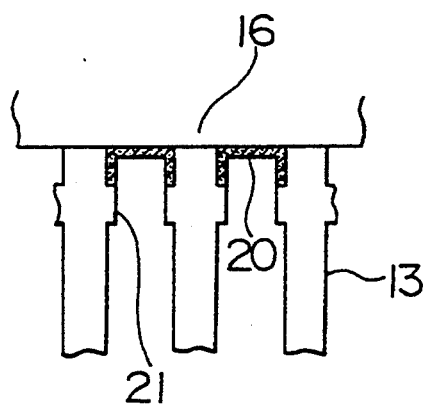
FIG. 22 is an enlarged view of the area E in FIG. 18 after cutting the tie bars.

FIG. 16A is a plan view of a base lead frame 110a of a lead frame 100a according to this embodiment, FIG. 16B is a plan view showing a condition that a bent dummy lead frame 120a is placed over the base lead frame 110a, and FIG. 16C is a sectional view taken along line D—D in FIG. 16B. In the lead frame of this embodiment, the base lead frame 110a is basically of the same structure as the counterpart in Embodiment 1. The bent dummy lead frame 120a is formed such that dummy leads 122a are bent as shown in FIG. 16C. When the bent dummy lead frame 120a is placed over the base lead frame 110a, the dummy leads 122a are each fitted between adjacent pairs of outer lead portions 116a so as to fill the gaps therebetween, as shown in FIG. 16B. With such an arrangement, a lead frame which requires no tie bars can also be obtained.

As described hereinabove, with the invention according to the first aspect, the lead frame comprises the base lead frame having no tie bars, and the dummy lead frame provided with the dummy leads to fill gaps between the outer lead portions of the leads, the dummy lead frame being placed over the base lead frame. Instead of tie bars, the dummy leads serve not only to reinforce the leads, but also stop the molten sealing resin which tends to flow into the gaps between the outer lead portions during resin molding. Therefore, using the lead frame of the invention makes it possible to eliminate the step of tie bar cutting, and to avoid the problems experienced with tie bar cutting in prior art manufacturing of semiconductor devices. Thus, wear or breakage of the tie bar cutting punch will not occur to cause failed products (deformation of leads), burr chips will not be scattered, and remnants of the tie bars after being cut will not be present in a region where the outer lead portions are to be bent, enabling the leads to be stably shaped with good accuracy. As a result, semiconductor devices can be manufactured with higher reliability. Additionally, manufacture of semiconductor devices using the lead frame of the invention will not be restricted by difficulties in manufacturing the tie bar cutting punch which requires high-level manufacture techniques, resulting in an advantage that the lead frame is adaptable for semiconductor devices with their outer lead portions having a fine pitch.

With the invention according to the second aspect, since the superposed portions of the base lead frame and the dummy lead frame are half etched, for example, so as to have the same thickness as the other portions of both the frames in the superposed condition, the lead frame of the invention has the same thickness as the prior art lead frame and can be used in conventional apparatus for manufacturing semiconductor devices. Therefore, no modifications are required in the apparatus for manufacturing semiconductor devices and an advantage of reducing the production cost can also be obtained in addition to the above advantages.

With the invention according to the third aspect, since the dummy leads of the dummy lead frame extend to just near the inner lead portions of the leads of the base lead frame, i.e., the sealing resin, the molten sealing resin which flows into the gaps between the outer lead portions during resin molding can be reduced to the utmost. This results in an advantage in that burrs between the leads can be made quite small and semiconductor devices can be produced with higher quality.

With the invention according to the fourth aspect, since the dummy lead frame is formed of a material having a larger coefficient of linear expansion than the material of the base lead frame so that the dummy leads fill the gaps between the outer lead portions more positively when heated, the burrs between the leads can be made quite small and semiconductor devices can be produced with higher quality.

With the invention according to the fifth aspect, since the dummy leads of the dummy lead frame are bent to fill the gaps between the outer lead portions of the leads when the dummy lead frame is placed over the base lead frame, the lead frame can be more easily manufactured.

Furthermore, with method of manufacturing semiconductor devices according to the sixth aspect of the invention, the steps until the package forming step are carried out by using the lead frame according to the first aspect under a condition that the dummy lead frame is placed over the base lead frame. In these steps, the dummy leads serve to, instead of tie bars, reinforce the leads and stop the molten sealing resin. After that, the dummy lead frame is separated from the base lead frame. Accordingly, the present method can dispense with the step of tie bar cutting. As a result, it is possible to avoid deformation of the leads, deposition of burr chips, and the presence of remnants of the tie bars after being cut in a region where the outer lead portions are to be cut, thereby ensuring manufacture of highly reliable semiconductor devices of which leads are stably shaped with high accuracy. Additionally, the method of manufacturing semiconductor devices according to the present method will not be restricted by high-level accuracy required in manufacturing the tie bar cutting punch, resulting in an advantage that the present method is adaptable for semiconductor devices with their outer lead portions having a fine pitch.

What is claimed is:

1. A lead frame for manufacturing resin molded type semiconductor devices, said lead frame comprising a base lead frame and a dummy lead frame, said base lead frame having a number of leads which comprise inner lead portions for sealing in a molded sealing resin and outer lead portions for exposure outside the molded sealing resin, said leads extending toward a center from a frame portion of said base lead frame, and said dummy lead frame being disposed on said base lead frame in use and having a number of dummy leads extending from a frame portion of said dummy lead frame substantially coplanar with and filling gaps between the outer lead portions of said leads.

2. The lead frame for semiconductor devices according to claim 1 wherein superposed portions of said base lead frame and said dummy lead frame are reduced in thickness so that the superposed portions have the same thickness as other portions of said lead and dummy lead frames.

3. The lead frame for semiconductor devices according to claim 1 wherein the dummy leads of said dummy lead frame extend to just adjacent the inner lead portions of said leads of said base lead frame.

4. The lead frame for semiconductor devices according to claim 1 wherein said dummy lead frame is formed of a material having a larger coefficient of linear expansion than said base lead frame so that the dummy leads fill gaps between the outer lead portions positively when heated.

5. The lead frame for semiconductor devices according to claim 1 wherein the dummy leads of said dummy lead frame are so bent as to fill gaps between the outer lead portions of said leads when said dummy lead frame is disposed on said base lead frame.

* * * * *